United States Patent
Zhou et al.

(10) Patent No.: US 9,393,666 B2
(45) Date of Patent: Jul. 19, 2016

(54) ADAPTER PLATE FOR POLISHING AND CLEANING ELECTRODES

(71) Applicant: Lam Research Corporation, Fremont, CA (US)

(72) Inventors: Catherine Zhou, Fremont, CA (US); Duane Outka, Fremont, CA (US); Cliff LaCroix, Livermore, CA (US); Hong Shih, Walnut, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 231 days.

(21) Appl. No.: 14/137,049

(22) Filed: Dec. 20, 2013

(65) Prior Publication Data
US 2015/0179416 A1    Jun. 25, 2015

(51) Int. Cl.
  B24B 41/06    (2012.01)
  H01J 37/32    (2006.01)

(52) U.S. Cl.
  CPC ............. B24B 41/06 (2013.01); H01J 37/3288 (2013.01)

(58) Field of Classification Search
  CPC ........... B23Q 3/103; B25H 5/006; B25B 5/10
  See application file for complete search history.

(56) References Cited

U.S. PATENT DOCUMENTS

| | | | |
|---|---|---|---|
| 5,824,605 A | 10/1998 | Chen et al. | |
| 5,948,704 A | 9/1999 | Benjamin et al. | |
| 6,013,155 A | 1/2000 | McMillin et al. | |
| 6,300,651 B1 | 10/2001 | Kato | |
| 6,333,272 B1 | 12/2001 | McMillin et al. | |
| 6,390,901 B1 * | 5/2002 | Hiyama | B24D 9/085 451/285 |
| 6,824,627 B2 | 11/2004 | Dhindsa et al. | |
| 7,147,548 B1 * | 12/2006 | Mehrabi | B24B 7/186 125/38 |
| 8,870,170 B2 * | 10/2014 | Chen | F16M 11/043 269/56 |
| 8,931,772 B2 * | 1/2015 | Phillips | B25B 5/06 269/289 R |
| 2015/0179416 A1 * | 6/2015 | Zhou | B24B 41/06 451/364 |

\* cited by examiner

*Primary Examiner* — Lee D Wilson
(74) *Attorney, Agent, or Firm* — Buchanan Ingersoll & Rooney PC

(57) ABSTRACT

An adapter plate configured to be attachable to a universal platen of a cleaning unit for cleaning upper electrodes from a plasma processing chamber is disclosed, the adapter plate includes a support surface and a mounting surface configured to be fastened to the universal platen of the cleaning unit. The support surface is configured to support an inner electrode or an outer electrode of a showerhead electrode assembly for cleaning upper or lower surfaces thereof. The support surface having a first set of holes configured to receive pins engaged in an upper surface of the inner electrode, a second set of holes configured to receive pins surrounding an outer periphery of the inner electrode, a third set of holes configured to receive pins engaged in an upper surface of the outer electrode, and a fourth set of holes configured to receive pins surrounding an outer periphery of the outer electrode.

19 Claims, 8 Drawing Sheets

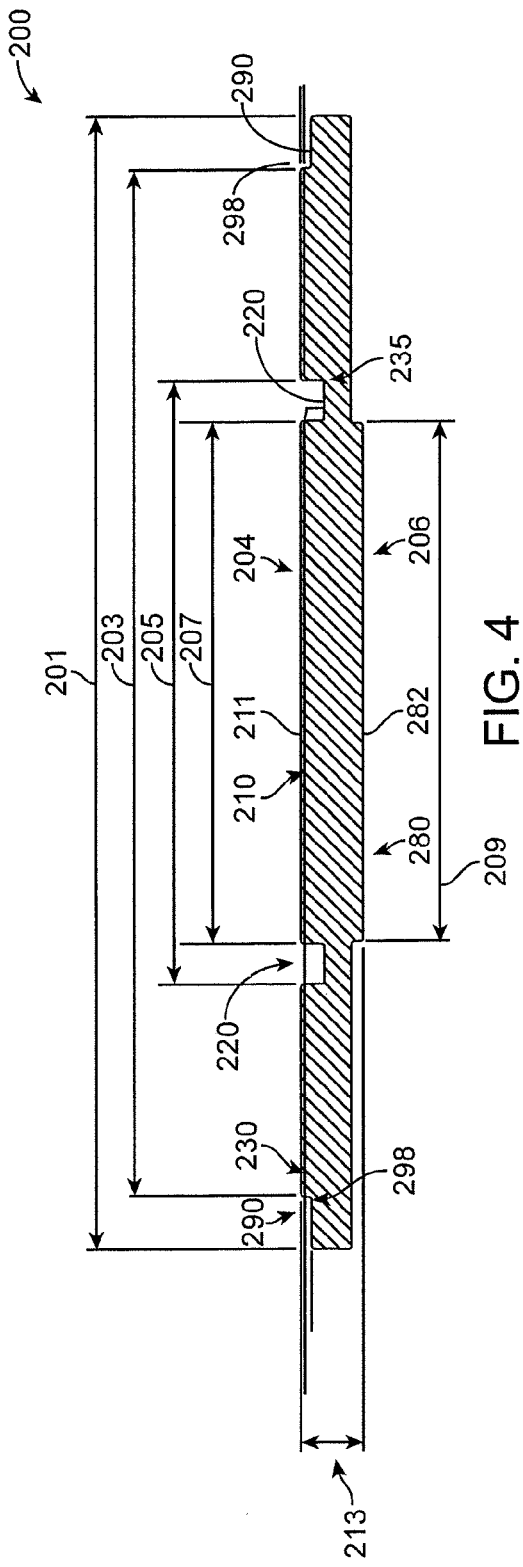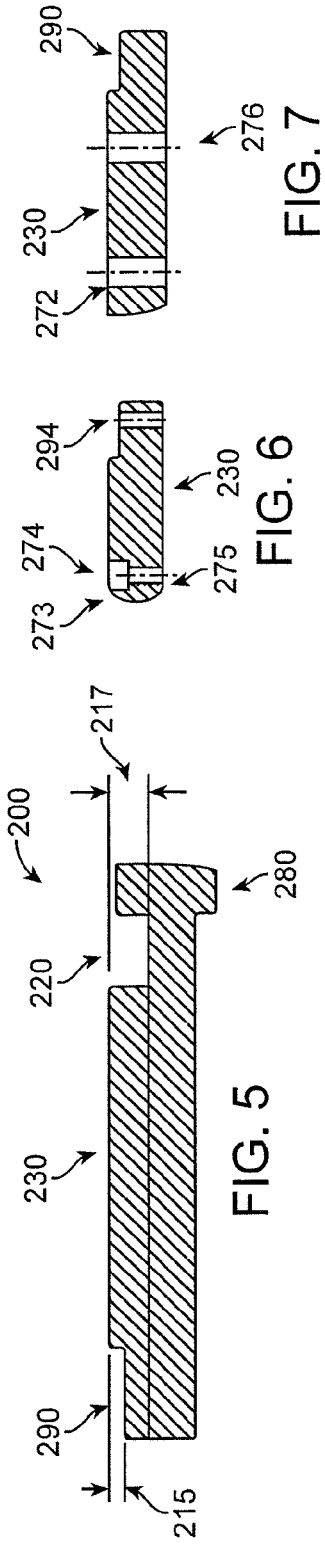

ADAPTER PLATE FOR POLISHING AND CLEANING ELECTRODES

BACKGROUND

Plasma processing apparatuses can be used to process semiconductor substrates by techniques including etching, physical vapor deposition (PVD), chemical vapor deposition (CVD), and resist removal. One type of plasma processing apparatus used in plasma processing includes a reaction chamber containing top and bottom electrodes. A radio frequency (RF) power is applied between the electrodes to excite a process gas into a plasma for processing semiconductor substrates in the reaction chamber. The plasma may contain ions, free radicals, and neutral species with high kinetic energies. By adjusting the electrical potential of the substrate, charged species in the plasma can be directed to impinge upon the surface of the substrate and thereby remove material (e.g., atoms) therefrom.

During etching, a heavy deposition of contaminants on electrodes or electrode assemblies, for example, 450 mm Talon electrodes, can result in changes to the wafer etch rate and defects and/or particles in the chamber. In addition, the heavy deposition typically cannot be cleaned from the surface of the electrodes unless it is polished. Without proper polishing of the electrodes, the manufactured components can be damaged, and for example, the thickness may not be uniform and maintained within the manufacturers specifications. Accordingly, it would be desirable to have an adapter plate which can be used to polish the top and bottom surfaces, for example, of both an outer and inner electrode of an upper electrode assembly.

SUMMARY

An adapter plate configured to be attachable to a universal platen of a cleaning unit for cleaning upper electrodes from a plasma processing chamber is disclosed, the adapter plate comprising: a support surface and a mounting surface, the mounting surface configured to be fastened to the universal platen of the cleaning unit, and the support surface configured to support an inner electrode or an outer electrode of a showerhead electrode assembly for cleaning upper or lower surfaces thereof, the support surface having a first set of holes configured to receive pins engaged in an upper surface of the inner electrode, a second set of holes configured to receive pins surrounding an outer periphery of the inner electrode when the lower surface of the inner electrode is supported on the support surface, a third set of holes configured to receive pins engaged in an upper surface of the outer electrode, and a fourth set of holes configured to receive pins surrounding an outer periphery of the outer electrode when the lower surface of the outer electrode is supported on the support surface.

A kit for polishing silicon electrodes is disclosed, the kit comprising: an adapter plate configured to be attachable to a universal platen of a cleaning unit for cleaning upper electrodes from a plasma processing chamber, the adapter plate comprising: a support surface and a mounting surface, the mounting surface configured to be fastened to the universal platen of the cleaning unit, and the support surface configured to support an inner electrode or an outer electrode of a showerhead electrode assembly for cleaning upper or lower surfaces thereof, the support surface having a first set of holes configured to receive pins engaged in an upper surface of the inner electrode, a second set of holes configured to receive pins surrounding an outer periphery of the inner electrode when the lower surface of the inner electrode is supported on the support surface, a third set of holes configured to receive pins engaged in an upper surface of the outer electrode, and a fourth set of holes configured to receive pins surrounding an outer periphery of the outer electrode when the lower surface of the outer electrode is supported on the support surface; a plurality of annular pins configured to fit within one or more holes within the upper surface of the adapter plate; and a polishing tool.

BRIEF DESCRIPTION OF THE DRAWINGS

FIG. 4 is a cross-sectional view of the adapter plate as shown in FIG. 2 in accordance with an exemplary embodiment.

FIG. 5 is a cross-section view of an outer edge of the adapter plate as shown in FIG. 2 in accordance with an exemplary embodiment.

FIG. 6 is a cross-sectional view of the adapter plate as shown in FIG. 2 extending from one of the middle holes to one of the outer recess holes.

FIG. 7 is a cross-sectional view of the adapter plate as shown in FIG. 2 extending from one of the inner holes to one of the outer holes.

DETAILED DESCRIPTION

Plasma chambers are generally used for etching layers of materials on substrates by supplying an etching gas comprising one or more gases to the chamber and applying energy to the etching gas to energize the gas into a plasma state. Various plasma chamber designs are known wherein radio frequency (RF) energy, microwave energy and/or magnetic fields can be used to produce and sustain medium density or high density plasma.

In such plasma processing chambers process gas is supplied through a suitable arrangement such as a showerhead electrode or gas injection system and a semiconductor substrate supported on a lower electrode is plasma etched by plasma generated by supplying RF energy to the process gas.

For a metal etch process, the lower electrode assembly can be incorporated in a transformer coupled plasma (TCP™) reactor. Transformer coupled plasma reactors, wherein RF energy is inductively coupled into the reactor, are available from Lam Research Corporation, Fremont, Calif. An example of a high-flow plasma reactor that can provide high density plasma is disclosed in commonly-owned U.S. Pat. No. 5,948,704, the disclosure of which is hereby incorporated by reference in its entirety.

Figure 1:
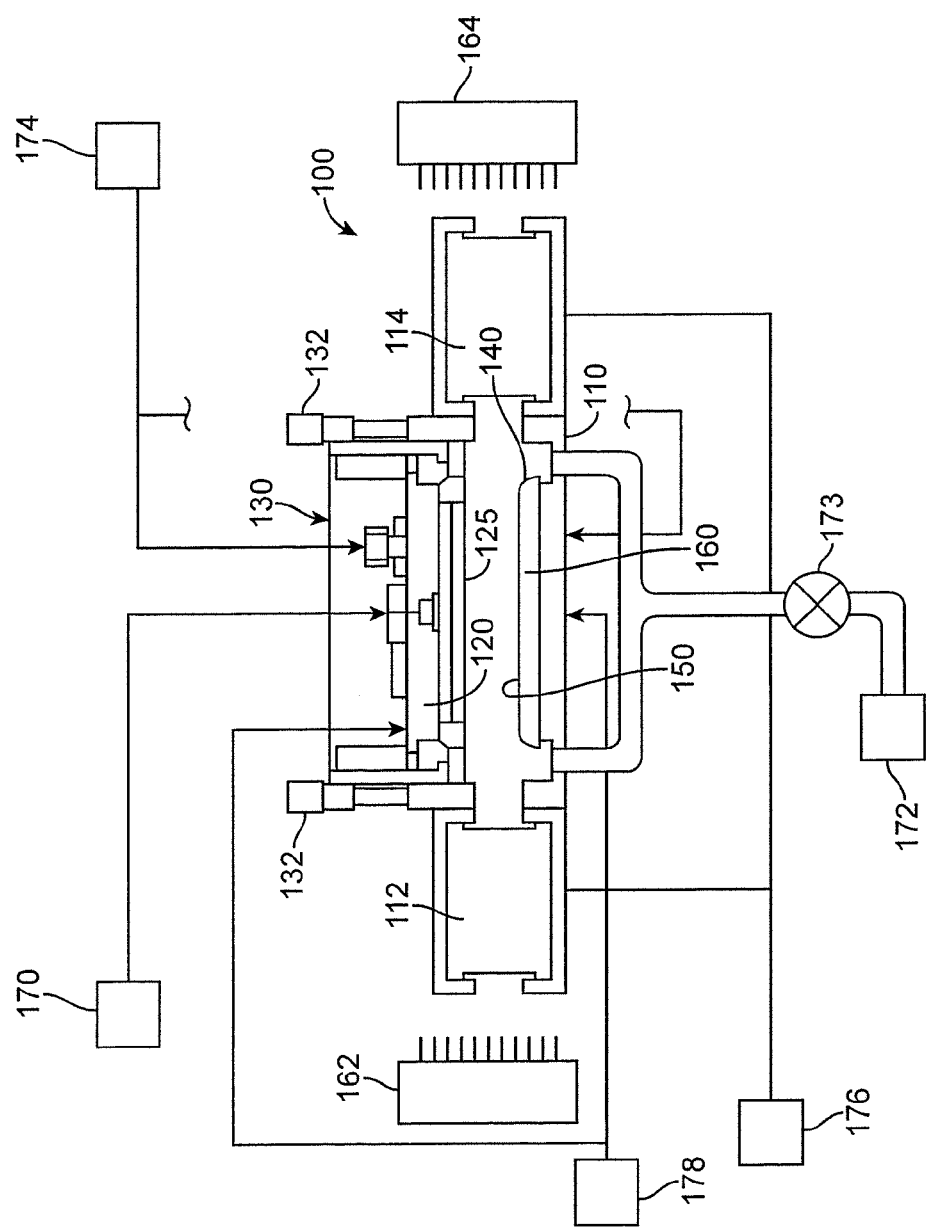
FIG. 1 is an illustration of an exemplary plasma processing apparatus.

An exemplary parallel plate plasma etch reactor is illustrated in FIG. 1. The plasma etch reactor 100 comprises a chamber 110, an inlet load lock 112, and an optional outlet load lock 114, further details of which are described in commonly-owned U.S. Pat. No. 6,824,627, which is hereby incorporated by reference in its entirety. The load locks 112 and 114 (if provided) include transfer devices to transfer substrates such as wafers from a wafer supply 162, through the chamber 110, and out to a wafer receptacle 164. A load lock pump 176 can provide a desired vacuum pressure in the load locks 112 and 114.

A vacuum pump 172 such as a turbo pump is adapted to maintain a desired pressure in the chamber. During plasma etching, the chamber pressure is controlled, and preferably maintained at a level sufficient to sustain a plasma. Too high a chamber pressure can disadvantageously contribute to etch stop while too low a chamber pressure can lead to plasma extinguishment. In a medium density plasma reactor, such as a parallel plate reactor, for example, the chamber pressure can be maintained at a pressure below about 200 mTorr (e.g., less than 100 mTorr or less than 50 mTorr). The vacuum pump can be connected to an outlet in a wall of the reactor and can be throttled by a valve 173 in order to control the pressure in the chamber. Preferably, the vacuum pump is capable of maintaining a pressure within the chamber of less than 200 mTorr while etching gases are flowed into the chamber.

The chamber 110 includes an upper electrode assembly 120 can include an upper electrode 125 (e.g., showerhead electrode), and a lower electrode assembly 140 including a baseplate or lower electrode 160 and a substrate support surface 150 formed in an upper surface thereof. The upper electrode assembly 120 is mounted in an upper housing 130. The upper housing 130 can be moved vertically by a mechanism 132 to adjust the gap between the upper electrode 125 and the substrate support surface 150.

An etching gas source 170 can be connected to the housing 130 to deliver etching gas comprising one or more gases to the upper electrode assembly 120. In an exemplary etch reactor, the upper electrode assembly comprises a gas distribution system, which can be used to deliver reactant and/or carrier gases to a region proximate to the surface of a substrate. Gas distribution systems, which can include one or more gas rings, injectors and/or showerheads (for example, showerhead electrodes), are disclosed in commonly-owned U.S. Pat. Nos. 5,824,605; 6,013,155; 6,300,651; and 6,333,272, the disclosures of which are hereby incorporated by reference in their entirety.

The upper electrode 125 preferably comprises a showerhead electrode, which includes apertures (not shown) to distribute etching gas therethrough. The showerhead electrode 125 can comprise one or more vertically spaced-apart baffle plates that can promote the desired distribution of etching gas. The upper electrode 125 can be a one-piece electrode (e.g., a disc-shaped showerhead electrode with gas injection holes), or a multi-piece electrode (e.g., an inner disc-shaped showerhead electrode surrounded by an outer electrode ring, such as a continuous or segmented ring without gas injection holes). The upper and lower electrodes 125, 160 may be formed of any suitable material such as graphite, silicon, silicon carbide, aluminum (e.g., anodized aluminum), or combinations thereof. A heat transfer liquid source 174 can be connected to the upper electrode assembly 120 and another heat transfer liquid source can be connected to the baseplate 160.

Figure 2:
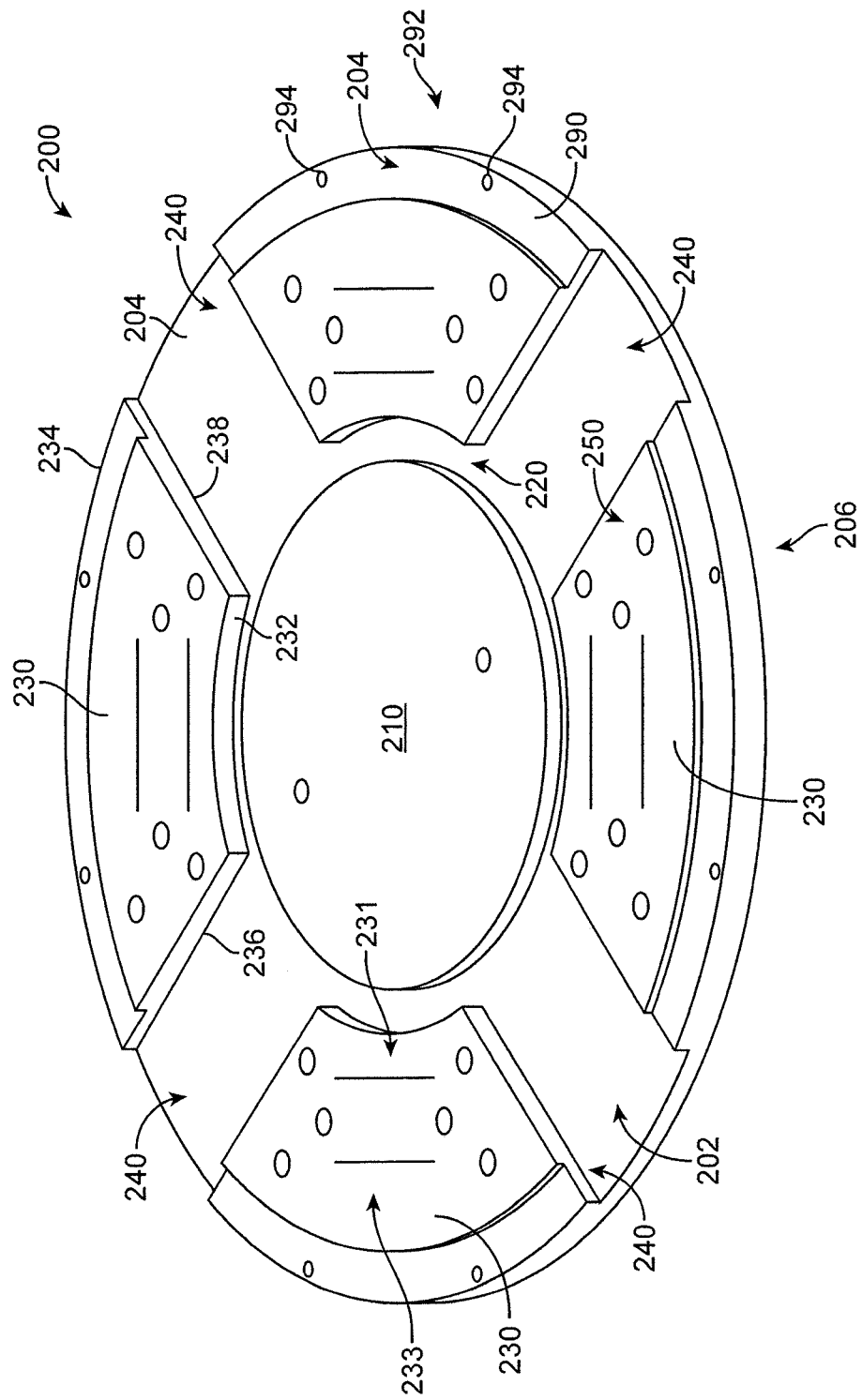
FIG. 2 is a perspective view of an adapter plate for cleaning electrodes in accordance with an exemplary embodiment.

FIG. 2 is a perspective view of an adapter plate 200 in accordance with an exemplary embodiment. As shown in FIG. 2, the adapter plate 200 is configured to be attachable or mountable to a universal platen 510 of a cleaning unit 500 (FIG. 10) for cleaning an inner electrode 300 or an outer electrode 400 of an upper electrode assembly 125 received from a plasma processing chamber 110. The adapter plate 200 can be comprised of an annular plate 202 having a support surface 204 and a mounting surface 206. The mounting surface 206 is preferably configured to be fastened or mounted to the universal platen 510 of the cleaning unit 500. The support surface 204 is configured to receive an inner electrode 300 or an outer electrode 400.

In accordance with an exemplary embodiment, the support surface 204 has an annular inner surface 210, an annular channel 220 configured to surround the annular inner surface 210, and a plurality of outer surfaces 230 surrounding the annular channel 220. Each of the plurality of outer surfaces 230 preferably has a curved inner edge 232, a curved outer edge 234, and a pair of side edges 236, 238. A plurality of side channels 240 is located between each of the adjacent outer surfaces 230.

In accordance with an exemplary embodiment, each of plurality of outer surfaces 230 has one or more sets of holes 250 configured to receive an annular pin or rod 330 (See FIGS. 8a-8d). The annular pin 330 can be configured to secure the inner electrode 300 or outer electrode 400 to the upper surface of the plate 200. Each of the plurality of outer surfaces 230 on the support surface 204 can include an inner mark 231 and an outer mark 233, which are configured to identify a location for the placement of a double sided tape or similar adhesive (not shown). The double sided tape or adhesive can assist with the securing of the inner and outer electrodes 300, 400 to the support surface 204 of the adapter plate 200 during cleaning.

Each of the plurality of outer surfaces 230 can also include an outer recess 290 on an outer perimeter 292 of the annular plate 202. Each of the outer recesses 290 can include a set of recess holes (a fourth set of holes) 294, which are configured to receive a non-threaded end of a pin or rod 330. In accordance with an exemplary embodiment, the annular channel 220, the plurality of side channels 240, and the outer recess can assist and/or act as flow channels for removal of cleaning solutions and/or water from underneath the inner electrodes 300 or outer electrode 400 during polishing and from the support surface 204 of the adapter plate 200.

Figure 3:
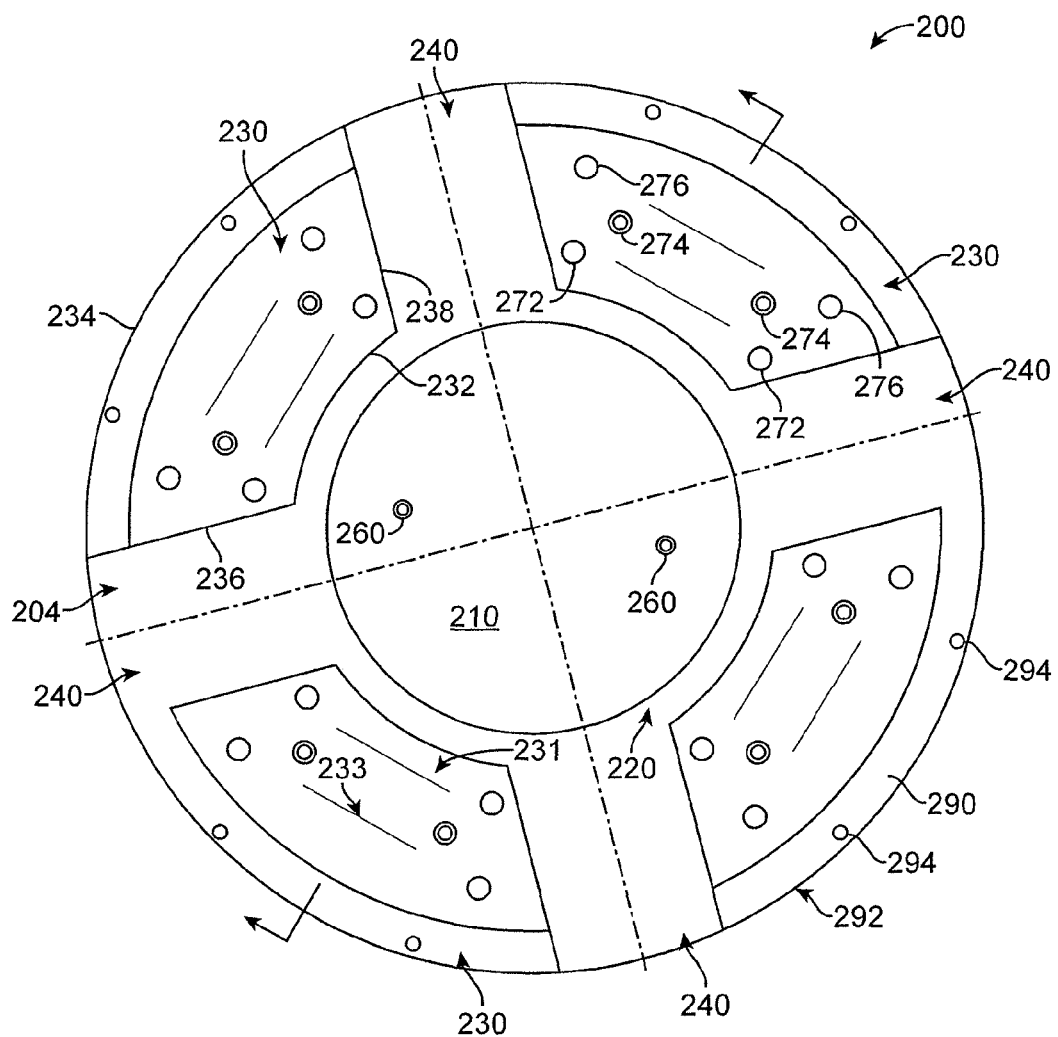
FIG. 3 is a top view of the adapter plate as shown in FIG. 2 in accordance with an exemplary embodiment.
Figure 8A:
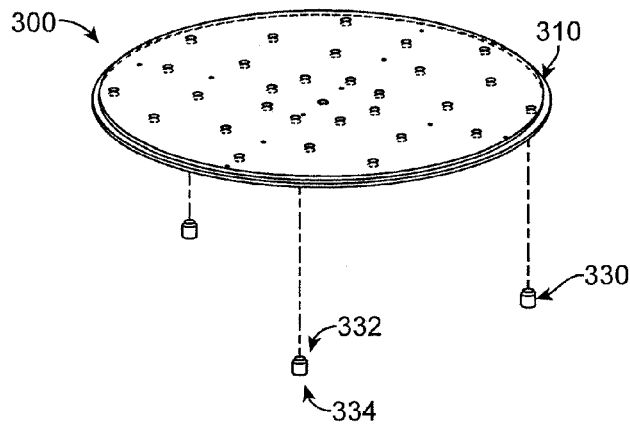
FIGS. 8a-8d are a series of views of a top side and a bottom side of an inner electrode of an upper electrode assembly.
Figure 8B:
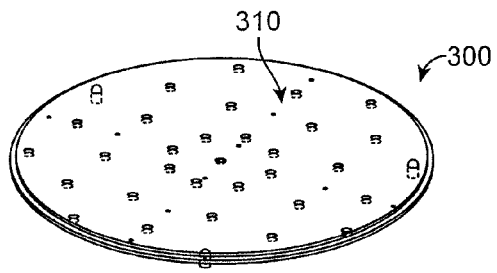
Figure 8C:
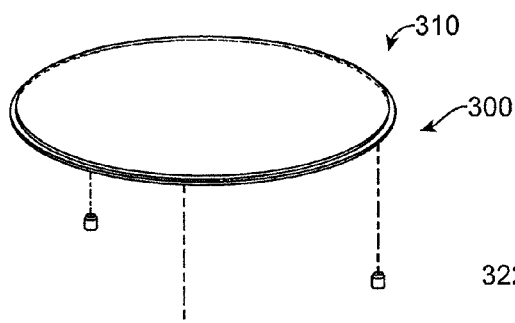
Figure 8D:
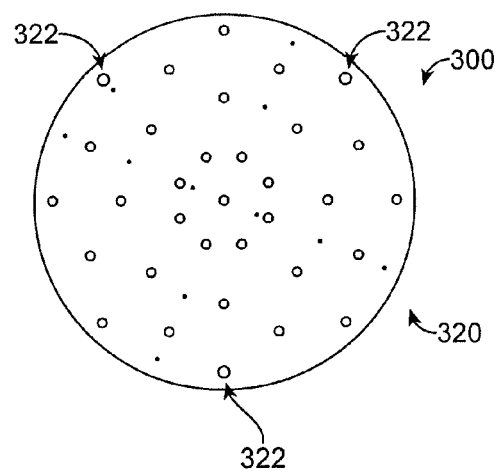
Figure 9A:
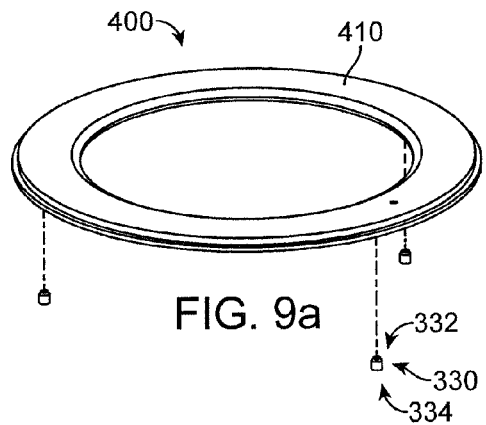
FIGS. 9a-9d are series of views of a top side and a bottom side of an outer electrode of an upper electrode assembly.
Figure 9B:
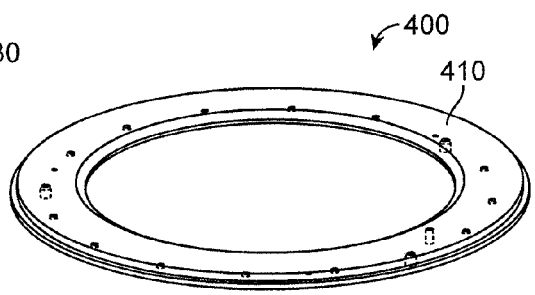
Figure 9C:
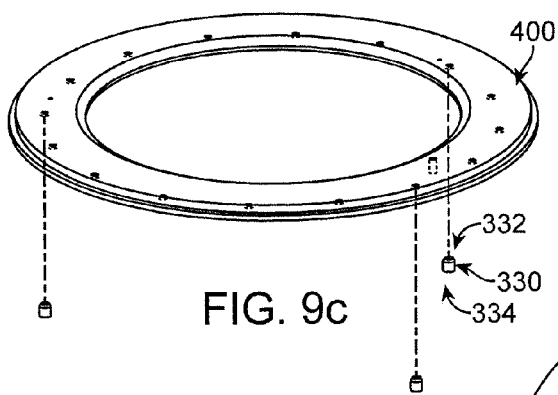
Figure 9D:
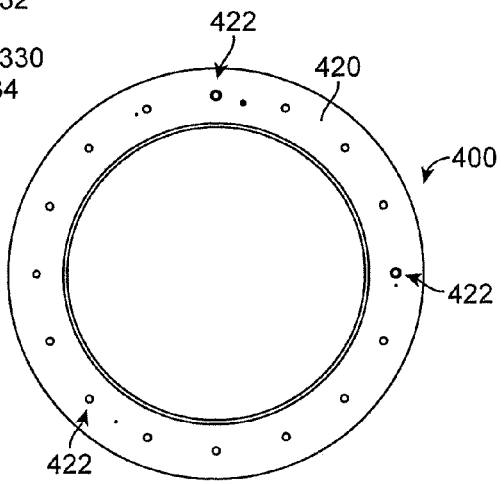

FIG. 3 is a top view of the adapter plate 200 as shown in FIG. 2 in accordance with an exemplary embodiment. As shown in FIG. 3, the adapter plate 200 is preferably an annular plate 202 having an annular inner surface 210, an annular channel 220 configured to surround the annular inner surface 210, and a plurality of outer surfaces 230 surrounding the annular channel 220. The annular inner surface 210 preferably include two or more holes 260 extending from the support surface 204 to the mounting surface 206. In accordance with an exemplary embodiment, the at least two holes 260 are configured to receive a threaded fastener 262, for example, a threaded bolt or screw, which attaches the adapter plate 200 to the universal platen 510. In accordance with an exemplary embodiment, for example, the two or more holes 260 can be two holes 260, which are 180 degrees from one another.

In accordance with an exemplary embodiment, the plurality of outer surfaces 230 can be four (4) outer surfaces 230, which are equally spaced around an outer perimeter of the support surface 204 of the annular plate 202. Each of the plurality of outer surfaces 230 preferably has a curved inner edge 232, a curved outer edge 234, and a pair of side edges 236, 238. In accordance with an exemplary embodiment, each of the plurality of outer surfaces 230 including at least 3 sets of holes 272, 274, and 276, which are configured to receive an annular pin or rod 330. For example, in accordance with an exemplary embodiment, each of the plurality of outer surfaces 230 includes a pair of inner holes (a first set of holes) 272, a pair of middle holes (a second set of holes) 274, and a pair of outer holes (a third set of holes) 276. Each of the inner holes 272, the middle holes 274 and the outer holes 276 are at a given distance or radius from the center of the adapter plate 200.

For example, in accordance with an exemplary embodiment, each of the inner holes 272 are about 45 degrees from an adjacent inner hole 272. In accordance with an exemplary embodiment, each of the middle holes 274 are about 30 degrees from each corresponding hole 274 within the same outer surface 230 and 60 degrees from an adjacent middle hole 274 on an adjacent outer surface 230. In accordance with an exemplary embodiment, each of the outer holes 276 is about 45 degrees from a corresponding outer hole 276 within the same outer surface 230.

Figure 10:
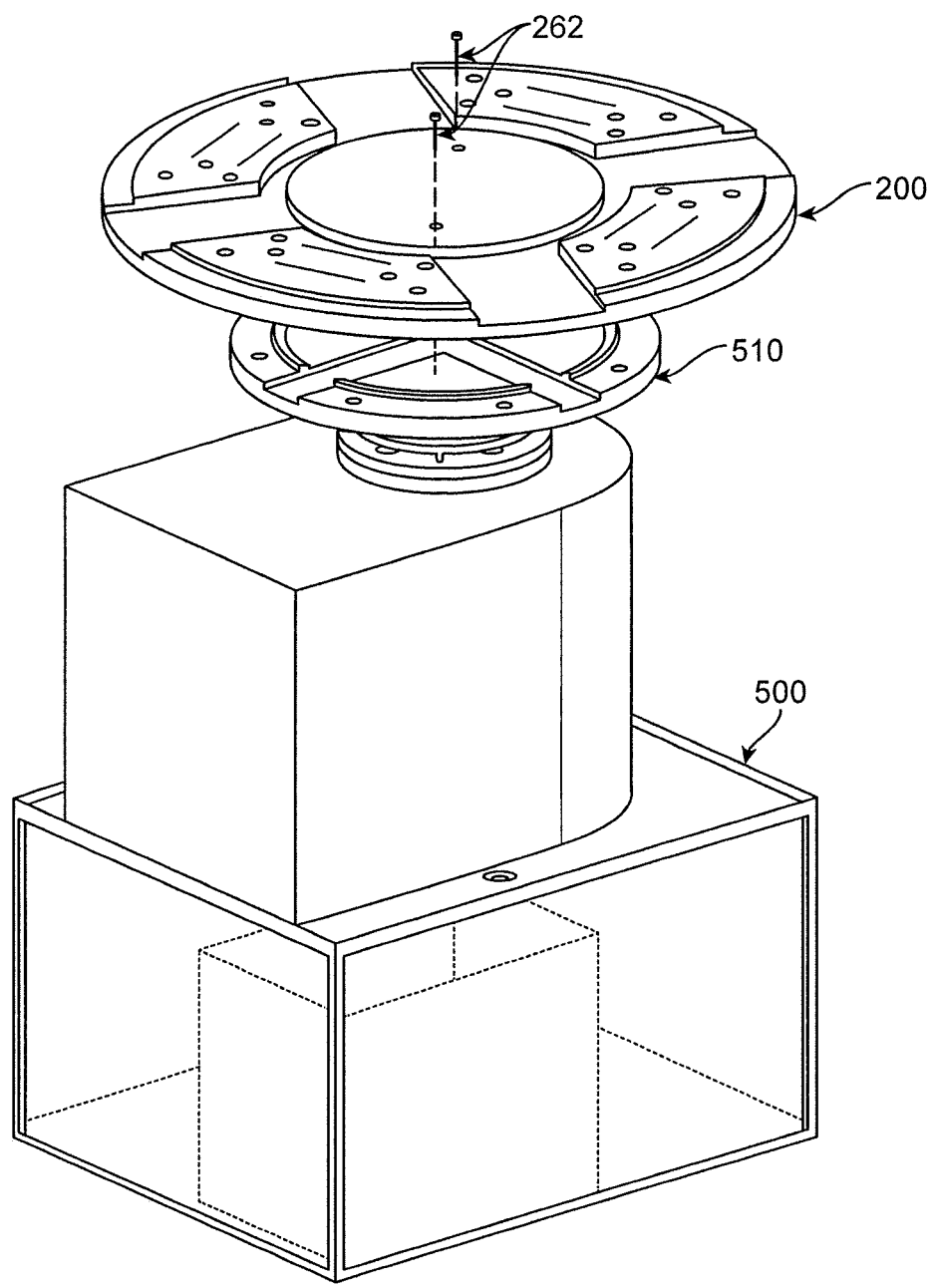
FIG. 10 is a perspective view of an adapter plate attached to a universal platen on a cleaning unit in accordance with an exemplary embodiment.

FIGS. 4 and 5 are cross-sectional views of the adapter plate 200 as shown in FIG. 2 in accordance with an exemplary embodiment. As shown in FIGS. 4 and 5, the support surface 204 has an annular inner surface 210, an annular channel 220 configured to surround the annular inner surface 210, and a plurality of outer surfaces 230 surrounding the annular channel 220. The mounting surface 206 of the adapter plate 200 has an annular inner surface 280 configured to fit within a groove or recess on an upper surface of the universal platen 510 (FIG. 10).

In accordance with an exemplary embodiment, the adapter plate 200 has an outer diameter 201 of about 26 to 28 inches, and more preferably about 27 inches. In addition, the recesses 290 on the outer perimeter 292 of each of the outer surfaces 230 preferably have a diameter 203 of about 24 to 25 inches from an inner edge 298 of one recess 290 to the inner edge 298 of a corresponding recess 290 on an opposite outer surface 230. In accordance with an exemplary embodiment, the recesses 290 have a width of about 1.50 to 2.0 inches, and more preferably about 1.75 inches. An outer edge 235 of each of the outer surfaces 230 are preferably about 7.0 to about 7.4 inches from the center point of the adapter plate 200, and more preferably about 7.2 inches, for a diameter 205 of about 14.0 inches to about 14.8 inches. The annular inner surface 210 on the support surface 204 preferably has a diameter 207 of about 12.0 to 12.88 inches, and more preferably about 12.44 inches. The annular inner surface 280 on the mounting surface 206 preferably has a diameter 209 of about 12.0 to 12.8 inches, and more preferably about 12.4 inches.

In accordance with an exemplary embodiment, the adapter plate 200 has a thickness or width 213 from an upper surface 211 of the annular inner surface 210 to a lower surface 282 of the annular inner surface 280 on the mounting surface 206 of the adapter plate 200 of about 1.5 to about 1.55 inches. In accordance with an exemplary embodiment, for example, each of the recesses 290 on the outer perimeter 292 of the outer surfaces 230 can have a depth 215 of about 0.1 to 0.0105 inches, and the annular channel 220 can have a depth 217 of about 0.565 inches.

FIG. 6 is a cross-sectional view of the adapter plate as shown in FIG. 2 extending from one or the pairs of middle holes 274 to one of the outer recess holes 294. As shown in FIG. 6, the middle holes 274 can have an upper portion 273 having a greater diameter than a lower portion 275 of the middle hole 274. In accordance with an exemplary embodiment, the recess holes 294 preferably have a uniform diameter.

FIG. 7 is a cross-sectional view of the adapter plate 200 as shown in FIG. 2 extending from one of the inner holes 272 to one of the outer holes 276. As shown in FIG. 7, in accordance with an exemplary embodiment, each of the inner holes 272 and the outer holes 276 preferably has a uniform diameter.

In accordance with an exemplary embodiment, the adapter plate 200 can be manufactured or produced from a plastic material, for example, a polypropylene, a photopolymer, and/or a natural material.

FIGS. 8a-8d are a series of perspective views (FIGS. 8a-8c) of a top side 310 of an inner electrode 300 and a top view (FIG. 8d) of a bottom side 320 of an upper electrode assembly 125 in accordance with an exemplary embodiment.

In accordance with an exemplary embodiment, the threaded screws or pins 330 have a thread on one end 332 thereof, which is configured to be threaded or screwed into the tapped holes on the bottom side 320 of the inner electrode 300, for example, the outermost set of tapped holes 322 on the bottom side 320 of the inner electrode 300. The other end 334 of the threaded screw or pin can have a relatively rounded or smooth surface and can be configured to be received on the support surface 204 of the adapter plate 200 in the innermost set of holes (or first set of holes) 272. In accordance with an exemplary embodiment, the threaded screws or pins 330 can be placed about 120 degrees from one another on the support surface 204 of the adapter plate 200. The inner electrode 300 can then be placed on the support surface 204 of the annular plate 200 and the top side of the inner electrode can be polished with a hand tool 600 (FIG. 12).

In accordance with an exemplary embodiment, the bottom side 320 of the inner electrode 300 can be polished by removing the inner electrode 300 from the top polishing set up and placing a double sided adhesive tape (not shown) of about 4 inches in length on the adapter plate 200 on the inner mark 231 between the inner most set of holes 272. In each of the middle holes 274, a pin or rod 330 can be placed. The inner electrode 300 can be placed on the on adapter plate 200 with the bottom side 320 facing upward with inner electrode 300 surrounded by the pins or rods 330 in the inner most holes 272 and held in place by the double sided adhesive tape. The bottom side 320 of the inner electrode 300 can then be polished with a hand tool 600.

FIGS. 9a-9d are a series of perspective views (FIGS. 9a-9c) of a top side 410 of an outer electrode 400 and a top view (FIG. 9d) of a bottom side 420 of an upper electrode assembly 125. In accordance with an exemplary embodiment, the threaded screws or pins 330 have a thread on one end 332 thereof, which is configured to be threaded or screwed within the tapped holes 422 on the bottom side 420 of the inner electrode 400. The other end 334 of the threaded screws or pins can have a relatively rounded or smooth surface and can be configured to be received on the upper surface of the adapter plate 200. In accordance with an exemplary embodiment, the threaded screws or pins 330 can be placed about 120 degrees from one another within the tapped holes (not shown) on the bottom side 420 of the inner electrode 400. The inner electrode 400 can then be placed on the support surface 204 of the annular plate 200 and the top side 410 of the outer electrode 400 can be polished with a hand tool 600.

Figure 12:
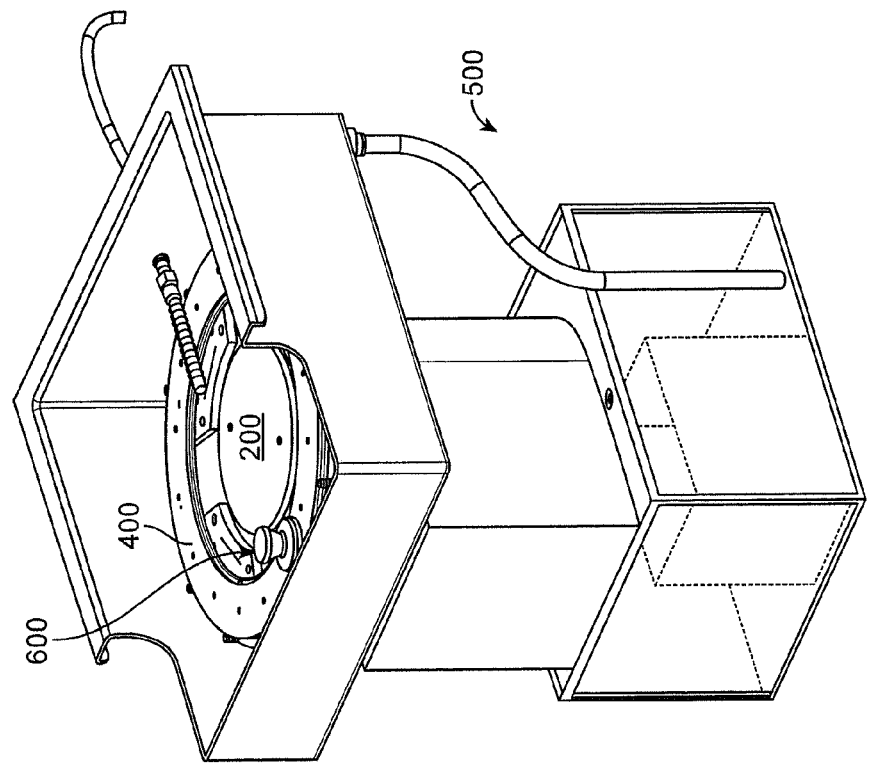
FIG. 12 is a perspective view of the bottom side of an outer electrode on an adapter plate in accordance with an exemplary embodiment.
Figure 11:
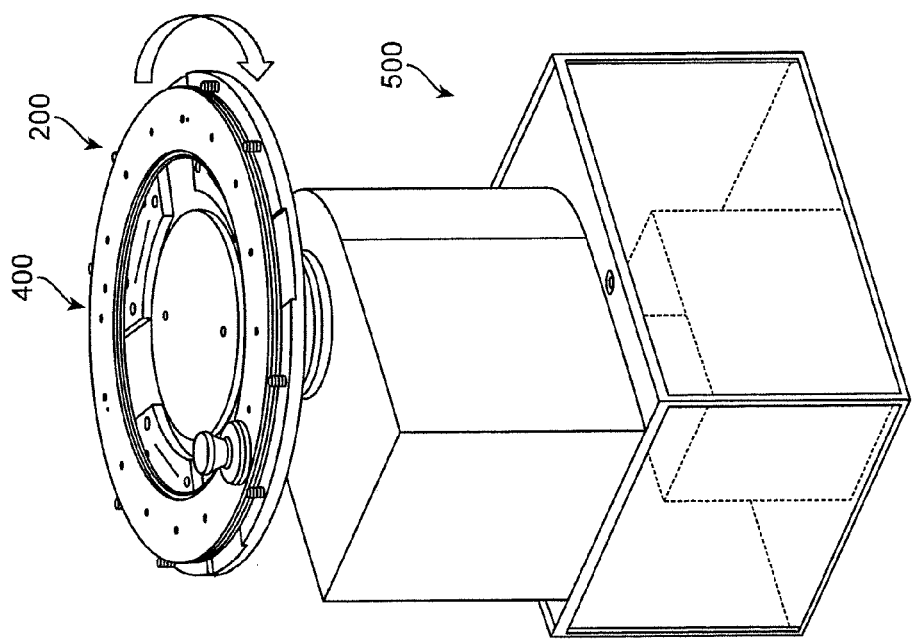
FIG. 11 is a perspective view of the adapter plate on a universal platen on a cleaning unit in accordance with an exemplary embodiment.

FIGS. 10-12 are perspective view of an adapter plate 200 attached to a universal platen 510 on a cleaning unit 500. As shown in FIG. 10, the adapter plate 200 is configured to be attachable to the universal platen 510 via the two or more holes 260 extending through the adapter plate 200. For example, in accordance with an exemplary embodiment, the adapter plate 200 can be attached to an upper surface 520 of the universal platen 510 with one or more fasteners 262, such as threaded screws or bolts.

As shown in FIGS. 11 and 12, the bottom side 420 of the outer electrode 400 can be polished by removing the outer electrode 400 from the top polishing set up and cutting a double sided adhesive tape to about 4 inches in length and placing the double sided tape (or adhesive) on the adapter plate 200 on the outer mark 233 between the outer most set of holes 276. In each of the recess holes 294, a threaded pin 330 can be placed. As shown in FIGS. 11 and 12, the outer electrode 400 can be placed on the on adapter plate 200 with the bottom side 420 facing upward with outer electrode 400 surrounded by the threaded pins 330 in the recess holes 294 and held in place by the double sided tape. The bottom side 420 of the outer electrode 400 can then be polished with a hand tool 600.

When the word "about" is used in this specification in connection with a numerical value, it is intended that the associated numerical value include a tolerance of ±10% around the stated numerical value.

Moreover, when the words "generally", "relatively", and "substantially" are used in connection with geometric shapes, it is intended that precision of the geometric shape is not required but that latitude for the shape is within the scope of the disclosure. When used with geometric terms, the words "generally", "relatively", and "substantially" are intended to encompass not only features which meet the strict definitions but also features which fairly approximate the strict definitions.

It is to be understood that the form of this invention as shown is merely a preferred embodiment. Various changes may be made in the function and arrangement of parts; equivalent means may be substituted for those illustrated and described; and certain features may be used independently from others without departing from the spirit and scope of the invention as defined in the following claims.

What is claimed is:

1. An adapter plate configured to be attachable to a universal platen of a cleaning unit for cleaning upper electrodes from a plasma processing chamber, the adapter plate comprising:
   a support surface and a mounting surface, the mounting surface configured to be fastened to the universal platen of the cleaning unit, and the support surface configured to support an inner electrode or an outer electrode of a showerhead electrode assembly for cleaning upper or lower surfaces thereof, the support surface having a first set of holes configured to receive pins engaged in an upper surface of the inner electrode, a second set of holes configured to receive pins surrounding an outer periphery of the inner electrode when the lower surface of the inner electrode is supported on the support surface, a third set of holes configured to receive pins engaged in an upper surface of the outer electrode, and a fourth set of holes configured to receive pins surrounding an outer periphery of the outer electrode when the lower surface of the outer electrode is supported on the support surface wherein the support surface has an annular inner surface, an annular channel, which surrounds the annular inner surface, and a plurality of outer surfaces surrounding the annular channel, each of the plurality of outer surfaces having a curved inner edge, a curved outer edge, and a pair of side edges, and a plurality of side channels between adjacent outer surfaces, and wherein each of plurality of outer surfaces has one or more sets of holes configured to receive a pin and the adapter plate is an annular plate.

2. The adapter plate of claim 1, wherein the mounting surface of the adapter plate has an annular inner surface configured to fit within a recess on an upper surface of the universal platen.

3. An adapter plate configured to be attachable to a universal platen of a cleaning unit for cleaning upper electrodes from a plasma processing chamber, the adapter plate comprising:
   a support surface and a mounting surface, the mounting t red to be fastened to the universal platen of the cleaning unit, and the support surface configured to support an inner electrode or an outer electrode of a showerhead electrode assembly for cleaning upper or lower surfaces thereof, the support surface having a first set of holes configured to receive pins engaged in an upper surface of the inner electrode, a second set of holes configured to receive pins surrounding an outer periphery of the inner electrode when the lower surface of the inner electrode is supported on the support surface, a third set of holes configured to receive pins engaged in an upper surface of the outer electrode, and a fourth set of holes configured to receive pins surrounding an outer periphery of the outer electrode when the lower surface of the outer electrode is supported on the support surface, the mounting surface of the adapter plate has an annular inner surface configured to fit within a recess on an upper surface of the universal platen; and
   at least two holes arranged to extend from the annular inner surface on the support surface to the annular inner surface on the mounting surface and configured to receive a fastener, which attaches the adapter plate to the universal platen.

4. The adapter plate of claim 3, wherein the at least two holes are 180 degrees to one another.

5. The adapter plate of claim 1, comprising:
   a plurality of holes arranged on an upper surface of each of the plurality of outer surfaces, the plurality of holes including au inner pair of holes, a middle pair of holes, and an outer pair of holes, each of the plurality of holes configured to receive an annular portion of a pin.

6. The adapter plate of claim 1, comprising:
   an outer recess arranged on an outer edge of each of the plurality of outer surfaces.

7. The adapter plate of claim 1, wherein each of the outer recesses on the outer edge of each of the plurality of outer surface includes one or more holes configured to receive a pin.

8. The adapter plate of claim 1, wherein the adapter plate is an annular plate.

9. The adapter plate of claim 1, wherein the adapter plate is formed from a plastic material.

10. A kit for polishing silicon electrodes, the kit comprising:
    the adapter plate of claim 1
    a plurality of annular pins configured to fit within one or more holes within the upper surface of the adapter plate; and
    a polishing tool.

11. The kit of claim 10, wherein the support surface has an annular inner surface, an annular channel, which surrounds the annular inner surface, and a plurality of outer surfaces surrounding the annular channel, each of the plurality of outer surfaces having a curved inner edge, a curved outer edge, and a pair of side edges, and a plurality of side channels between adjacent outer surfaces, and wherein each of plurality of outer surfaces has one or more sets of holes configured to receive a pin.

12. The kit of claim 10, wherein the mounting surface of the adapter plate has an annular inner surface configured to fit within a recess on an upper surface of the universal platen.

13. The kit of claim 12, comprising:
at least two holes arranged to extend from the annular inner surface on the support surface to the annular inner surface on the mounting surface and configured to receive a fastener, which attaches the adapter plate to the universal platen.

14. The kit of claim 13, wherein the at least two holes are 180 degrees to one another.

15. The kit of claim 11, comprising:
a plurality of holes arranged on an upper surface of each of the plurality of outer surfaces, the plurality of holes including an inner pair of holes, a middle pair of holes, and an outer pair of holes, each of the plurality of holes configured to receive an annular portion of a pin.

16. The kit of claim 11, comprising:
an outer recess arranged on an outer edge of each of the plurality of outer surfaces.

17. The kit of claim 11, wherein each of the outer recesses on the outer edge of each of the plurality of outer surface includes one or more holes configured to receive a pin.

18. The kit of claim 11, wherein the adapter plate is an annular plate.

19. The kit of claim 10, wherein the adapter plate is formed from a plastic material.

* * * * *